United States Patent [19]
Masui et al.

[11] Patent Number: 5,328,317
[45] Date of Patent: Jul. 12, 1994

[54] STICK FEEDER

[75] Inventors: Mituhalu Masui; Kouzou Ohta, both of Shizuoka, Japan

[73] Assignee: Tenryu Technics Co., Ltd., Shizuoka, Japan

[21] Appl. No.: 895,263

[22] Filed: Jun. 8, 1992

[30] Foreign Application Priority Data

Jun. 13, 1991 [JP] Japan .................. 3-142052

[51] Int. Cl.[5] ........................................... B65B 21/02
[52] U.S. Cl. .................................. 414/403; 414/415; 269/156; 198/345.1
[58] Field of Search ............... 414/403, 404, 415, 416, 414/797.8; 198/345.1; 269/156; 29/739, 740, 741, 759, 809

[56] References Cited

U.S. PATENT DOCUMENTS

| 1,372,661 | 3/1921 | Secord | 269/156 |
| 3,950,095 | 4/1976 | Bouygues et al. | 269/156 |
| 4,760,924 | 8/1988 | Sato et al. | 414/403 |
| 4,761,106 | 8/1988 | Brown et al. | 414/403 |
| 4,860,439 | 8/1989 | Riley | 198/345.1 |
| 4,862,578 | 9/1989 | Holcomb | 414/403 |
| 4,952,109 | 8/1990 | Hendricks | 414/415 |
| 4,962,918 | 10/1990 | Yang | 269/156 |
| 5,135,098 | 8/1992 | Koibuchi | 198/345.1 |
| 5,154,316 | 10/1992 | Holcomb et al. | 414/403 |

FOREIGN PATENT DOCUMENTS

21401 of 1889 United Kingdom ................ 269/156

Primary Examiner—Michael S. Huppert
Assistant Examiner—R. B. Johnson

[57] ABSTRACT

A stick feeder comprising a stick for carrying a plurality of semiconductor devices housed therein, a holding block for receiving and holding semiconductor devices discharged sequentially from the stick; and a plurality stop members selectively detachably mounted to the holder for stopping semiconductor devices discharged from the said stick to the holding block, the width of the holding block being adjustable in a direction perpendicular to the workpiece feeding direction, and the mounting position of the stop member being adjustable with respect to the holder so that the stop position of a semiconductor device can be adjusted in the workpiece holding portion by varying the mounting position of the stop member.

5 Claims, 6 Drawing Sheets

STICK FEEDER

BACKGROUND OF THE INVENTION

1. Field of the Invention

The present invention relates to a stick feeder for conveying or feeding workpieces to a predetermined place, and particularly to an effective technology applicable to a stick feeder for conveying or feeding semiconductor devices.

2. Related Art Statement

Stick feeders are well known and comprise an elongated stick for carrying a plurality of workpieces housed therein; and a stopper/holding block for receiving and holding workpieces discharged sequentially from the stick.

A stick feeder with such a structure is used, for example, in a process where a workpiece such as a semiconductor device discharged to a stopper/holding block thereafter removed by means such as a vacuum pad, and carried to a predetermined place.

In the above type stick feeder, it is required that various sized workpieces be fed smoothly to and positioned reliably at a holding position by the stopper/holding block. To this end, various kinds of stopper/holding blocks corresponding to the sizes of workpieces must usually be prepared and exchanged in accordance with changes in the sizes of workpieces, in order to handle the various sized workpieces.

The stopper/holding block is formed by combining integrally a workpiece holding portion and a stopping portion, and therefore, it becomes relatively large, requiring much space for storing many kinds of stopper/holding blocks corresponding to workpieces of various sizes and making it difficult to make the stick feeder at low cost. Thus, a stick feeder of this type is both expensive and less flexible than desired.

SUMMARY OF THE INVENTION

The present invention provides a stick feeder with a simplified structure which can readily handle workpieces of different sizes, thus being of good versatility.

A typical invention disclosed in the present application will be briefly described as follows.

A stick feeder according to the present invention comprises:

a stick for carrying a series of workpieces housed therein;

a holding block for receiving and holding workpieces fed sequentially from the stick, the width of a workpiece holding portion of the holding block being adjustable in a direction perpendicular to the feeding direction of the workpieces; and a member for stopping the workpieces fed from the stick to the holder or holding block, the stop member being mounted detachably to the holder, and the mounting position of the stop member being adjustable with respect to the holder so that the stopping position of the workpiece at the workpiece holding portion can be adjusted.

The holder may have: an axial insertion hole for receiving the stop member extending in the direction of the workpiece movement; A slot opening through the outer peripheral surface of said holder, extending in the axial direction of the insertion hole and communicating there with, at least one end of the slot being open; and a plurality of radial arm receiving "lock" slots open to the outer peripheral surface and intersecting the axial slot to communicate with the insertion hole at different axial positions. In accordance with this holder structure, the stop member may have: a stop portion protruding toward the stick, to be inserted into the insertion hole of the holder; and an engaging or "lock" arm portion protruding radially from the outer peripheral surface of the stop portion and being able to be insertable into the axial and radial slots. Thus mounting position of the stop member with respect to the holder can be selectively varied by inserting the arm of the stop member selectively into one of the radial slots of the holder to engage and lock therein.

The holding block may comprise a pair of blocks which close toward and separate from each other in a direction perpendicular to the feeding direction of a workpiece.

These closing and separating movements of the divided blocks can be caused by a screw which is threaded reversely on opposite ends.

Also, it is convenient to provide a number of stop members respectively having stop portions of different lengths in the direction of protrusion.

The workpiece may be a semiconductor device.

The stick feeder according to the present invention can handle various kinds of workpieces with different widths by adjusting the width of the workpiece holding portion of the holding blocks in the direction perpendicular to the feeding direction of the workpiece. Also, the stick feeder can handle various kinds of workpieces with different lengths by varying the axial mounting position of the stop member to the holder and thus adjusting the stopping position of the workpiece in the workpiece holding portion. As a result, with a simplified structure, the stick feeder can easily and reliably hold various kinds of workpieces of different sizes, thus improving its versatility.

Further, when the holder has an insertion hole, an axial slot and a plurality of radial slots; and the stop member have a stop portion and an engaging portion, as described above, the mounting position of the stop member with respect to the holder can be easily and selectively varied by inserting the stop portion of the stopper member into the insertion hole of the holder and the arm of the stop member into the axial slot of the holder, respectively, and then engaging the arm with any one of the radial slots of the holder. As a result, the stop position of the workpiece can be adjusted by varying the mounting position of the stopper member with respect to the holder, and various workpieces with different lengths can be held readily and positively.

In the case where the holding block comprises a pair of divided blocks which can be moved toward and away from each other in a direction perpendicular to the feeding direction of the workpiece, various workpieces with different widths can be held readily and reliably by closing or separating the pair of divided blocks.

Furthermore, when the divided blocks are closed and separated by the screwing action of the screw which is threaded reversely, the width can be adjusted in the direction perpendicular to the workpiece feeding direction at the work holding portion with a simple screw structure, and in addition, a fine adjustment of the width can be readily and reliably carried out.

Also, if plural stop members with protrusions of different lengths are provided, several times more workpieces with different lengths can be handled.

The above mentioned and other objects and novel features of the present invention will be apparent from the following descriptions and the attached drawings.

DETAILED DESCRIPTION OF THE PREFERRED EMBODIMENTS

Figure 1:
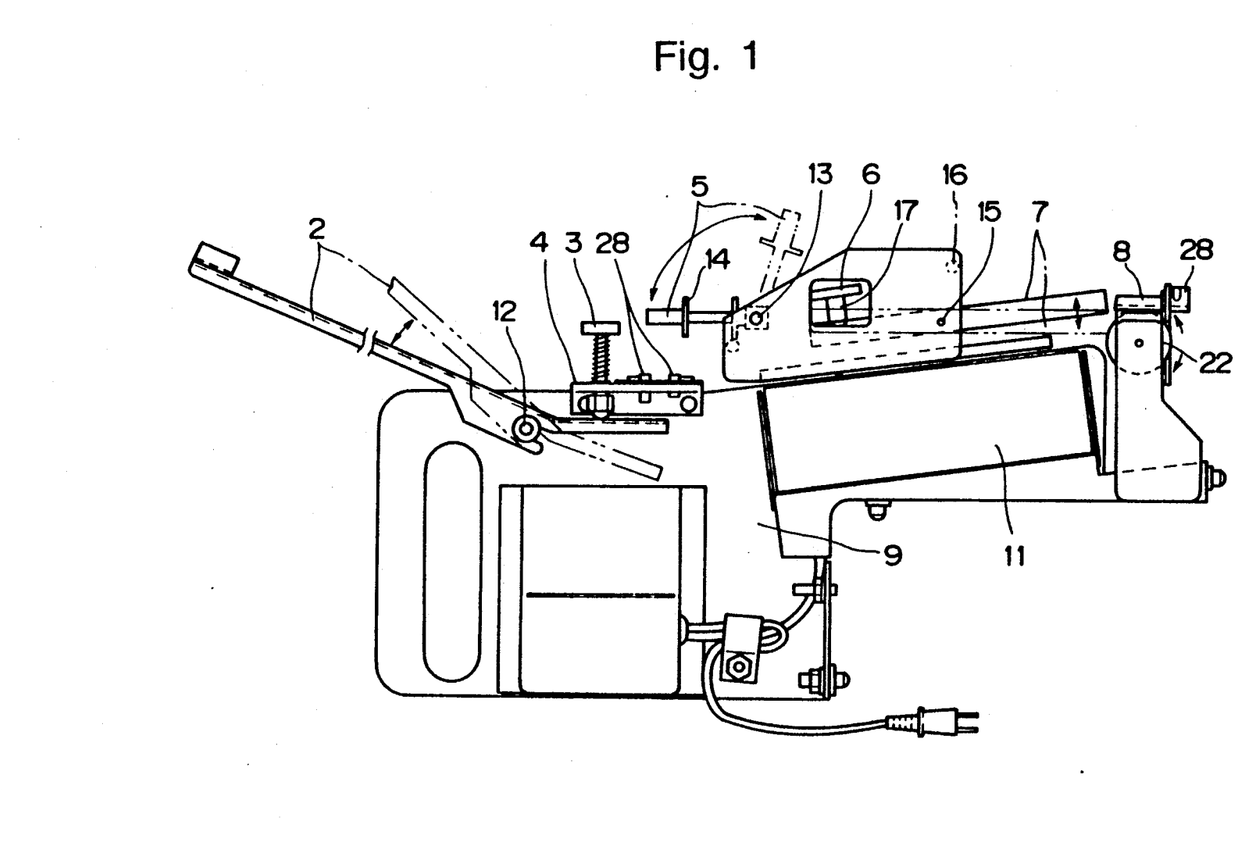
FIG. 1 is a side view showing a stick feeder of an embodiment of the present invention.
Figure 2:
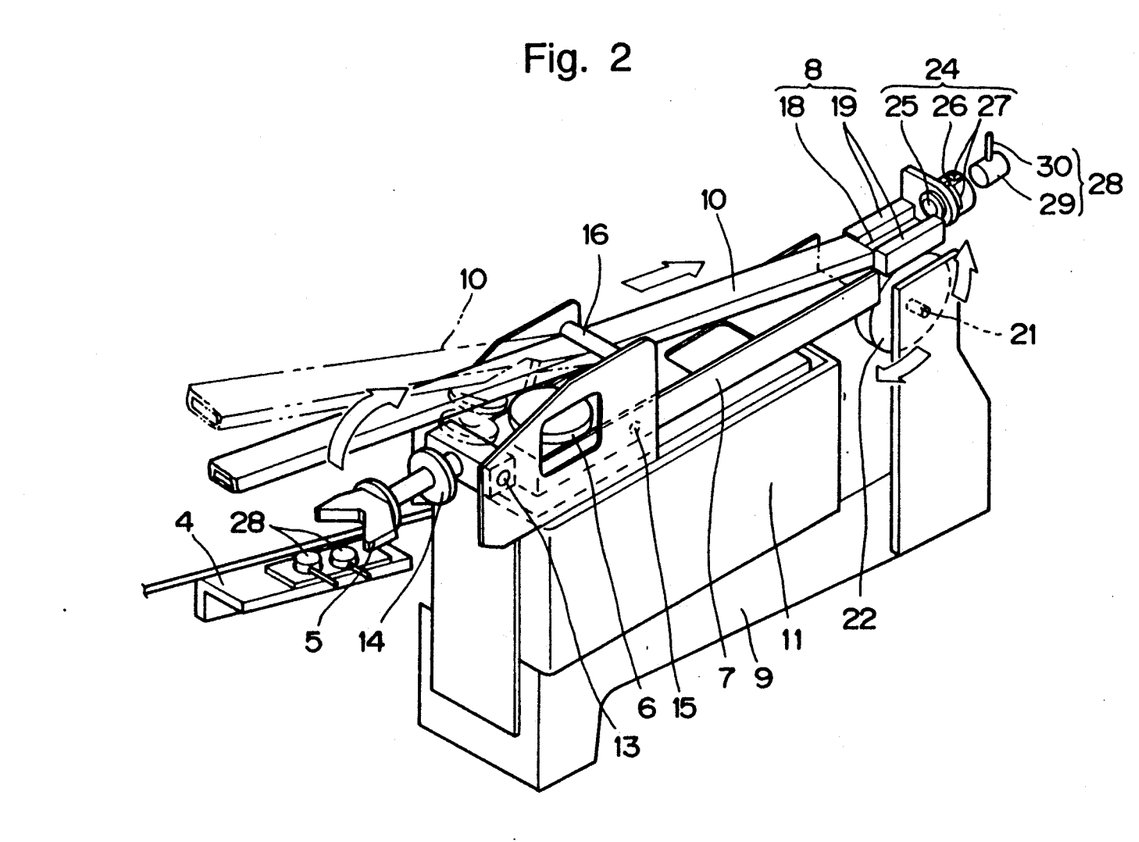
FIG. 2 is a perspective view showing the stick feeder of FIG. 1.

Referring to the drawings, FIGS. 1 and 2 show an embodiment of a stick feeder according to the present invention, which is used for feeding or supplying a semiconductor device as a workpiece 1. As shown in FIG. 1, to the main body 9 are arranged a first support 2, a support adjusting bolt 3, a pin holder 4, a stick angle adjusting bolt 5, a stick height adjusting wheel 6, a second support 7, and a holding block 8.

As shown in FIG. 2, in the stick feeder having such a structure, a stick 10 is mounted detachably in a downwardly and rightwardly inclined attitude toward the holding block 8 from the lefthand side of the feeder.

Figure 4:
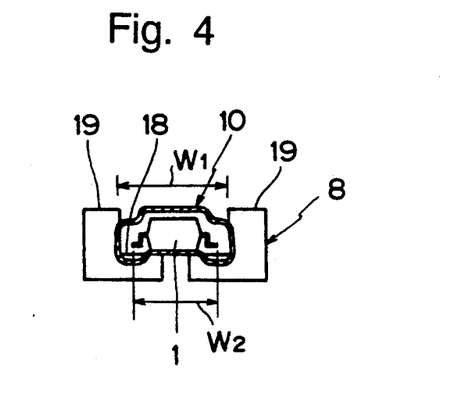
FIG. 4 shows a positional relation between a stick and the holding block of the stick feeder.

The stick 10 has a hollow longitudinal section as shown in FIG. 4, and a series of workpieces 1 are housed sequentially and lengthwise inside the stick.

Workpieces 1 accommodated in the stick 10 are carried downwardly and rightwardly toward the holding block 8 from the area of the stick angle adjusting bolt 5 by the downward inclination of said stick 10 toward the holding block 8 and by vibration of the stick 10 caused by the electromagnetic vibrating portion 11 of the main body 9. The workpieces are received and held sequentially by the holding block 8. The feeding speed of the workpiece 1 can be adjusted by rotating a speed control dial (not shown) on the control box using a screwdriver etc. to vary the vibration frequency of the stick 10.

Since replacement of the workpiece 1 or the stick 10 causes a variation in mass of the movable portion, the parameters of the vibration system for carrying the workpiece 1 vary, whereby the vibration efficiency is varied. The stick feeder according to the present embodiment, however, includes an electronic circuit provided with an oscillator and an inverter which varies the frequency and voltage of a power source for vibration separately and continuously. Hence, an optimum vibration can be obtained by a simple operation.

The first support 2 is mounted to the main body 9 by way of fulcrum 12 so that it can freely swing, and when lifted as shown in broken line in FIG. 1, it supports the lower surface of the stick 10 at the rear end of the stick. The first support 2, however, is only used in case of a long stick 10.

The first support 2 is fixed at a predetermined angle being adjusted by the vertical screw movement of the support adjusting bolt 3.

The stick angle adjusting bolt 5 is mounted to the main body 9 by way of the fulcrum 13 so that it can freely swing, and when lifted up, the stick angle adjusting bolt 5 supports the lower surface of a middle portion of the stick 10, as shown in broken line in FIG. 1.

The angle position of the stick angle adjusting bolt 5 is adjustable, and can be fixed by locking nut 14.

The second support 7 is mounted to the main body 9 by way of the fulcrum 15 so that it can freely swing, and supports the lower surface of the front end of the stick 10 by being lifted up as shown by the solid line in FIG. 1. The stick 10 is held at a predetermined angle, having the underside of its tip end supported by the second support 7, its upper surface middle portion being contacted with the fulcrum 16 arranged on the main body 9, and the front end thereof being in contact with the holding block 8.

The angle position of the second support 7 is adjusted by rotating the stick height adjusting wheel 6 to move a screw 17 vertically, and is maintained at a predetermined angle. By adjusting the angle position of the second support 7, the transfer level of the workpiece 1 from the stick 10 to the holding block 8 can be controlled. As shown in FIG. 4, the transfer level is adjusted in such a manner that the mounting surface of the stick 10 for the workpiece 1 is somewhat higher than the holding surface of the workpiece holding portion 18 of the holding block 8.

Figure 3:
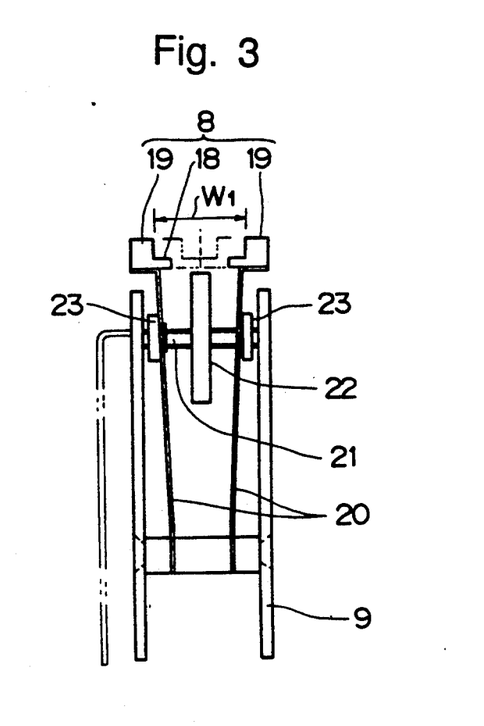
FIG. 3 is a front view showing an adjusting mechanism for a holding block of the stick feeder.

As shown in FIGS. 3 and 4, the holding block 8 is constructed with a pair of divided blocks 19 which can close toward and separate away from each other in a direction perpendicular to the workpiece feeding direction. The width $W_1$ perpendicular to the carrying direction of the workpieces at the work holding portion 18 can be adjusted by this closing and separating movement of the pair of divided blocks, making it possible to handle various widths $W_2$ of workpieces 1.

In the present embodiment, the adjusting mechanism, as shown in FIG. 3, comprises: a pair of leaf spring members 20,20 biased in the mutually opening directions and supporting the divided blocks onto the main body 9 respectively; a screw 21 penetrating the leaf spring members 20,20; a holding block width adjusting wheel 22 for rotating the screw 21; and a pair of nuts 23 with which opposite ends of the screw 21 respectively engage, the screw holes of the nuts being threaded reversely to each other. The nuts 23 mutually close or separate by rotating the screw 21, and hence, the divided blocks 19 close toward or separate away from each other so that the width $W_1$ of the workpiece holding portion 18 can be adjusted.

As shown in FIGS. 1 and 2, the holder 24 is mounted fixedly to the main body 1. The holder, as shown in FIGS. 5 to 8, has: an axial stop member insertion hole 25 penetrating in the workpiece feeding direction; a slot 26 formed open to the outer peripheral surface, extending in the axial direction of the insertion hole 25 and communicating therewith one end of the slot 36 in the extending direction is open; and a pair of radial slots 27,27 open to the outer peripheral surface, communicate with the insertion hole 25 and with slot 26. The radial slots 27,27 are spaced apart axially along the slot 26.

The aforesaid opening's and slots allow the stop member 28 to be mounted detachably to the holder 24 and stop a workpiece 1 fed from the stick 10 to the holding block 8.

As shown in FIGS. 5 to 8, the stop member 28 has a stop portion 29 inserted axially into the insertion hole 25 and protruding toward the stick 10; a radial engaging portion or 'clock' arm projects 30 from the outer peripheral surface of the stop portion 29 and insertable in the slots 27,27 through the slot 26.

By inserting and engaging the arm 30 of the stop member 28 selectively into one of slots 27,27 of the holder 24, the mounting position of the stopper 28 in the holder 24 becomes variable and the stopping position of the workpiece 11 in the workpiece holding portion 18 can be adjusted. Thus, the holding block 8 can handle workpieces of various lengths.

Figure 5:
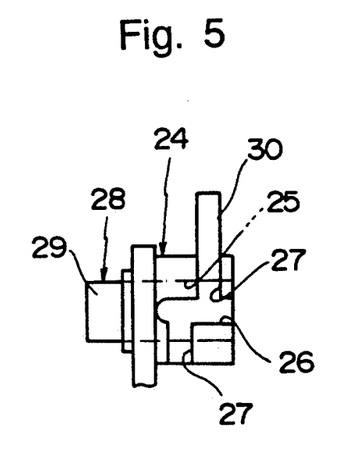
FIGS. 5 and 6 show engagement of a stop member with a holder at different positions.
Figure 6:
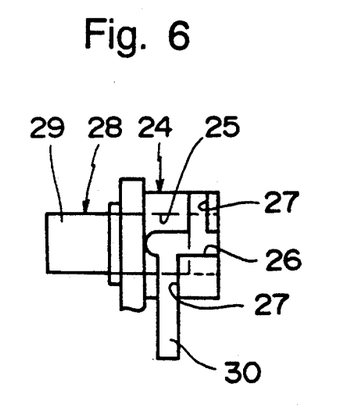
Figure 7:
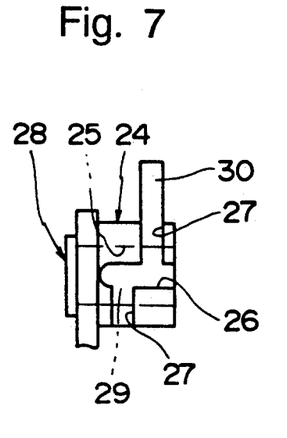
FIGS. 7 and 8 show engagement of another stop member of different size with the holder.
Figure 8:
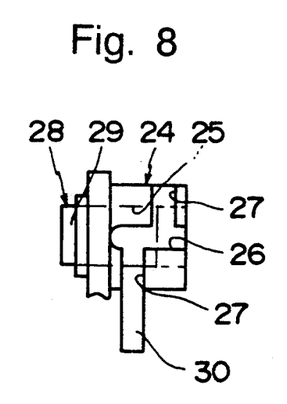

In the present embodiment, the stick feeder is provided with a pair of stop members 28 of respectively different lengths at their stop portions in the protruding direction (stop member 28 with longer stop portion 29 being shown in FIGS. 5 and 6 and stop member 28 with shorter stop portion 28 being shown in FIGS. 7 and 8). Hence, it is possible to handle various kinds of workpieces with different lengths by exchanging the stop members mounted to the holder 24. That is, in the stick feeder according to the present embodiment, combination of two slots 27 formed in the holder 24 and two stop members 28, the stopping position of the workpiece 1 in the workpiece holding portion 18 can readily be adjusted to four sizes.

As shown in FIG. 2, unused stop members 28 are set in the pin holder 4 and stored therein.

The operation of the present embodiment will be explained below.

The stick feeder of the present embodiment is used, for example, as follows:

First, as shown in solid line in FIG. 2, the stick 10 housing a series of workpieces 1 is inserted in to the stick feeder 9 so that the front open end of the stick 10 abuts against the holding block 8.

Next, as shown in broken line in FIG. 1, the stick angle adjusting bolt 5 is swing upwardly to the broken line position. After the stick angle adjusting bolt 5 is lifted up till there is no play of the stick 10, the angle of the stick angle adjusting bolt is fixed by fastening the locking nut 14.

The stick 10, as shown in FIG. 2, is supported at the lower surface of a middle portion and at the lower surface of the front end thereof by the stick angle-adjusting bolt 5 and by the second support 7 respectively. Also, the stick is in contact with the fulcrum 16 and the holding block 8 at the upper surface of the middle portion thereof and at its front end respectively. The stick 10 is thus held in a downwardly rightwardly inclined attitude relative to the main body 9.

Next, by rotating the holding block width adjusting wheel 22, the width $W_1$ of the workpiece holding portion 18 is adjusted so that the opposite inner surfaces of the stick 10 meet substantially with the opposite inner surfaces of the workpiece holding portion in the holding block 8, as shown in FIG. 4.

Next, the stick height adjusting wheel 6 is rotated to finely adjust the angle of the second support 7 so that the transfer level of the workpiece 1 from the stick 10 to the holding block 8 is adjusted. In this adjustment, as shown in FIG. 4, the mounting surface for the workpiece 1 in the stick 10 is adjusted so as to be somewhat higher than the holding surface of the workpiece holding portion 18 of the holding block 8.

Figure 9:
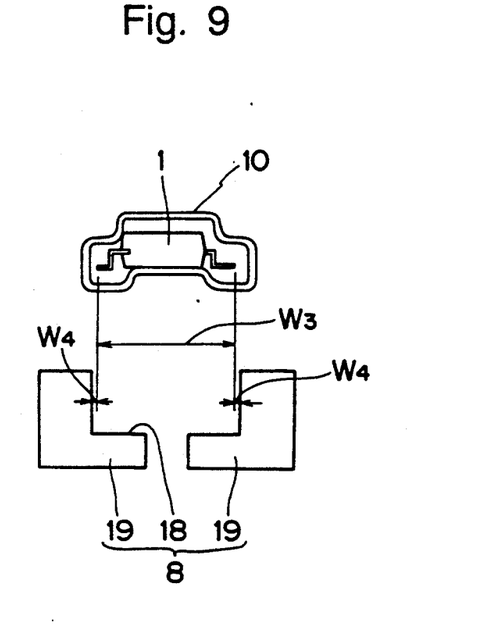
FIG. 9 shows widthwise relation between a workpiece and the holding block.

Next, the width $W_1$ of the workpiece holding portion 18 in the holding block 8 is adjusted finely again by means of the holding block width adjusting wheel 22, in line with the width $W_2$ of the workpiece 1. As shown in FIG. 9, the adjustment is performed so that the width of the workpiece holding portion 18 is slightly greater than the play range $W_3$ of the workpiece 1 within the stick 10, leaving a small play $W_4$.

Next, after picking a desired stop member 28 from the pin holder 4, the stop portion 29 of the member 28 and the arm 30 thereof are inserted into the insertion hole 25 of the holder 24 and the slot 26 respectively. Then, the arm 30 is inserted into and engaged with a desired radial slot 27 of the holder 24 by rotating the stop member 28.

Through these insertion and engaging operations, the stopper 28 is mounted to the holder 24 and the stop position in the workpiece holding portion 18 can be selectively adjusted.

In the embodiment shown in FIGS. 5 and 6, the stop position of the workpiece 1 can be adjusted by means of the stop member 28 as follows: Namely, when the arm 30 of the stop member 28 is inserted into and engaged with the slot 27 shown on the right side in FIG. 5, protrusion of the stop portion 29 extending from the insertion hole 25 is small. And when the arm 30 is inserted into and engaged with the slot 27 shown on the left side in FIG. 6, protrusion of the stop portion 29 extending from the insertion hole 25 becomes large.

Similarly, according to the stop member 28 shown in FIGS. 7 and 8, adjustment is made to give a short protrusion of the stop portion 29 extending from the insertion hole 25, when the arm 30 is inserted into and engaged with the slot 27, shown on the right side in FIG. 7, and to give a long protrusion of the stop portion 29 extending from the insertion hole 25 when the arm 30 is inserted into and engaged with the slot 27 on the left side in FIG. 8.

Hence, the stick feeder according to the present embodiment can adjust the stop position of the workpiece 1 at the workpiece holding portion 18 to four positions by means of two slots 27 formed in the holder 24 and two stop members 28.

After adjusting the stop position of the workpiece 1, the workpieces 1 housed in the stick 10 are conveyed toward the holding block 8 and sequentially held by the holding block 8, by vibrating the stick 10 by means of the electromagnetic vibrating portion 11 in the main body 9. Then, the workpieces 1 held in the holding block 8 are sequentially removed using a means (not shown) such as a vacuum pad and conveyed to a predetermined place.

Within the stick 10, the workpieces 1 are conveyed at a predetermined speed by rotating the speed control dial (not shown) in a control box with a screwdriver etc. to adjust the vibration frequency of the stick 10.

According to the stick feeder of the present embodiment, by adjusting the width $W_1$ of the holding block 8, the stick feeder can accommodate various widths $W_2$ of the workpiece 1, and also by adjusting the stop position for the workpiece 1 in the workpiece holding portion 18 by varying the mounting position of the stop member 28 with respect to the holder 24, the stick feeder can deal with various lengths of the workpiece 1. Therefore, with a simplified structure, workpieces 1 of various sizes can be easily held, thus increasing its versatility.

Further, the stop portion of the workpiece 1 in the workpiece portion 18 can be adjusted by rotating the stop member 28 for the arm 30 to engage with a desired slot 27 of the holder 24 after inserting a stop portion 29 into the insertion hole 25 and an arm of the desired stop members 28 into the slot 27 of the holder 24. Hence, the workpieces with various lengths can be held with a simplified structure.

Particularly, according to the present embodiment, the stop position of the workpiece 1 in the workpiece holding member 18 can be adjusted to four positions by means of the two radial slots 27 formed in the holder 24 and two stop members 28.

The width $W_1$ of the holding block 8 in the workpiece holding portion 18 can be easily adjusted by the divided blocks 19 which close and separate perpendicularly to the workpiece feeding direction by the function of the reverse screw. Therefore, with the simplified structure of the reverse screw the width $W_1$ of the workpiece 18 can be adjusted finely and easily.

As described above, the invention made by the present inventors has been explained in detail based on the embodiment shown. The present invention, however, should not be so restricted, and needless to say various modifications are possible without departing from the scope of the invention.

For example, the above embodiment is applied to a semiconductor device as a workpiece 1 fed or supplied, but workpieces used for the present embodiment should not be restricted to semiconductor devices.

Although, in the above embodiment, the holder 24 has two slots 27, the holder 24 may have a greater number of slots 27.

Also, in the above embodiment, the holder 24 has axial slot 26 with one open end, but the holder 24 may have a slot 26 with both ends open.

The typical advantages obtained by the present invention are briefly described as follows:

(1) According to the stick feeder of the present invention, by adjusting the width of the workpiece holding portion of the holding block perpendicular to the feeding direction of a workpiece, the stick feeder can deal with workpieces with various widths. Also, by varying the mounting position of the open member to the holder to adjust the stop position of the workpiece, workpieces of various lengths can be dealt with. Therefore, with the simplified structure, the stick feeder can hold readily and reliably workpieces with various sizes, thus improving its versatility.

(2) The holder is constructed to comprise an insertion hole in a workpiece feeding direction; a slot formed to be open to the outer peripheral surface of the holder and communicating with the insertion hole, extending in the axial direction of the insertion hole, and having at least one end open; and a plurality of radial slots formed to open to in the outer periphery surface of the holder and communicating with the insertion hole, communicating perpendicularly with the axial slot at axially spaced positions. And, the stop member comprises a stop portion inserted into the insertion hole and protruding toward the stick; and an arm which protrudes from the outer peripheral surface of the stop portion and can be inserted into a radial slot through the axial slot, so that the mounting position of the stop member to the holder is made variable by inserting and engaging the arm selectively with anyone of the radial slots. Hence, workpieces with various lengths can be held readily and reliably by inserting the stop portion and the arm of the stop member into the insertion hole and the axial slot of the holder respectively, and inserting and engaging selectively the arm into one of the radial slots, to adjust the stop position of the workpiece at the workpiece holding portion.

(3) The holding block is formed of a pair of divided blocks which can close toward and separate away from each other perpendicularly to the workpiece feeding direction. Hence, workpieces with various widths can be held readily and reliably by closing in and separating the pair of the divided blocks to adjust the space therebetween perpendicularly to the workpiece feeding direction in the workpiece holding portion.

(4) The divided blocks can close or separate by means of a simple screw mechanism with a reverse screw. Hence, the space perpendicular to the workpiece feeding direction in the workpiece holding portion can be adjusted, a fine adjustment of the space being easily performed.

(5) When various kinds of the stop members with protrusions of different lengths are provided, several times more types of workpieces with different lengths can be handled.

What is claimed is:

1. A stick feeder, comprising:
an elongated stick for housing and carrying a series of workpieces;
a holding block for receiving and holding the workpieces sequentially discharged from the stick, a workpiece holding portion of said holding block being adjustable in a direction perpendicular to a feeding direction of said workpieces; and
a holder mounted adjacent said holding block,
a stop member for stopping the workpieces fed from the stick to the holding block mounted detachably to said holder, a mounting position of said stop member with respect to the holder being changeable so that a stopping position of the workpieces can be adjusted at the workpiece holding member in accordance with the change of the mounting position,
said holder comprising an axial insertion hole, a slot open to an outer periphery of the holder and extending in the axial direction of the insertion hole, said slot communicating with said insertion hole, with at least one end thereof being open; and a plurality of radial slots open to the outer periphery of the holder and communicating with said insertion hole and with said axial slot, said radial slots being spaced axially along said axial slot: and
said stop member comprising a stop portion adapted to be inserted into said insertion hole and to protrude toward said stick; an arm protruding radially from an outer peripheral surface of said stop portion and selectively insertable into and engagable with one of said radial slots through said axial slot;
the mounting position of said stop member to said holder thus being variable to vary the stop position of the workpieces.

2. The stick feeder according to claim 1, wherein:
said holding block is formed of a pair of divided blocks which can close toward and separate away from each other in a direction perpendicular to the carrying direction of the workpieces.

3. The stick feeder according to claim 2, wherein:
the divided blocks can close and separate by means of screw and nut assembly with the nuts rotatable in opposite directions on rotation of the screw.

4. The stick feeder according to claim 1, comprising a number of stop members having stop portions of different lengths in the direction of protrusion.

5. The stick feeder according to claim 1, wherein: said workpieces are semiconductor devices.

* * * * *